US012638315B2

(12) United States Patent
Ohtake

(10) Patent No.: US 12,638,315 B2
(45) Date of Patent: May 26, 2026

(54) ELECTRONIC COMPONENT HOUSING

(71) Applicant: NIDEC COMPONENTS CORPORATION, Tokyo (JP)

(72) Inventor: Kazuto Ohtake, Sano (JP)

(73) Assignee: NIDEC COMPONENTS CORPORATION, Tokyo (JP)

( * ) Notice: Subject to any disclaimer, the term of this patent is extended or adjusted under 35 U.S.C. 154(b) by 92 days.

(21) Appl. No.: 18/893,621

(22) Filed: Sep. 23, 2024

(65) Prior Publication Data

US 2025/0012608 A1    Jan. 9, 2025

Related U.S. Application Data

(63) Continuation of application No. PCT/JP2022/046605, filed on Dec. 19, 2022.

(30) Foreign Application Priority Data

Mar. 24, 2022    (JP) ................................. 2022-048540

(51) Int. Cl.
    *G01D 11/24* (2006.01)
    *G01L 19/14* (2006.01)
    *H05K 5/13* (2025.01)

(52) U.S. Cl.
    CPC ............. *G01D 11/245* (2013.01); *H05K 5/13* (2025.01); *G01L 19/142* (2013.01)

(58) Field of Classification Search
    CPC .......... G01D 11/245; H05K 5/13; H05K 5/03; H05K 5/0247; H05K 5/0217; H05K 5/04; H05K 7/1427; G06F 1/181; G01L 19/142
    See application file for complete search history.

(56) References Cited

U.S. PATENT DOCUMENTS

| 5,008,487 A | * | 4/1991 | Shimmyo | ............ | H05K 9/0045 |
| | | | | | 174/373 |
| 5,124,888 A | * | 6/1992 | Suzuki | ................ | H05K 7/1428 |
| | | | | | 361/740 |
| 5,546,278 A | * | 8/1996 | Bethurum | .............. | H05K 7/142 |
| | | | | | 235/487 |

(Continued)

FOREIGN PATENT DOCUMENTS

| JP | S58191674 | 12/1983 |
| JP | S6155406 | 4/1986 |

(Continued)

OTHER PUBLICATIONS

International Search Report issued in corresponding International Application PCT/JP2022/046605, mailed Mar. 7, 2023.

*Primary Examiner* — Hiwot E Tefera
(74) *Attorney, Agent, or Firm* — Burris Law, PLLC

(57) ABSTRACT

A casing is capable of preventing loosening of screws. A first attachment part of a first casing is fixed to a third surface of a block using a first screw. A second attachment part of a second casing is fixed to a fourth surface of the block using a second screw. Both upper surfaces of the first and the second casing are fixed using a third screw. The first and second screws are arranged on each side in a direction intersecting a longitudinal direction of the first and second casings, and the third screw is arranged on one side in the direction intersecting the longitudinal direction of the first casing.

7 Claims, 5 Drawing Sheets

(56)  References Cited

U.S. PATENT DOCUMENTS

| | | | | |
|---|---|---|---|---|
| 2007/0070606 A1* | 3/2007 | Guo | H05K 9/005 | |
| | | | 361/714 | |
| 2008/0019096 A1* | 1/2008 | Nakajima | H05K 5/13 | |
| | | | 361/752 | |
| 2011/0229258 A1* | 9/2011 | Hirota | H05K 5/13 | |
| | | | 403/364 | |
| 2012/0212883 A1* | 8/2012 | Hargreaves | H05K 5/04 | |
| | | | 361/679.01 | |
| 2014/0328021 A1* | 11/2014 | Tang | H05K 7/20781 | |
| | | | 361/699 | |
| 2019/0150318 A1* | 5/2019 | Furuya | H05K 7/20181 | |
| | | | 361/692 | |
| 2021/0100111 A1* | 4/2021 | Nishikawa | H05K 5/0247 | |
| 2022/0053656 A1* | 2/2022 | Lee | G06F 1/187 | |
| 2022/0354008 A1* | 11/2022 | Han | H05K 5/0204 | |

FOREIGN PATENT DOCUMENTS

| | | |
|---|---|---|
| JP | S62142881 | 9/1987 |
| JP | H05090985 | 12/1993 |
| JP | 2003299230 | 10/2003 |

* cited by examiner

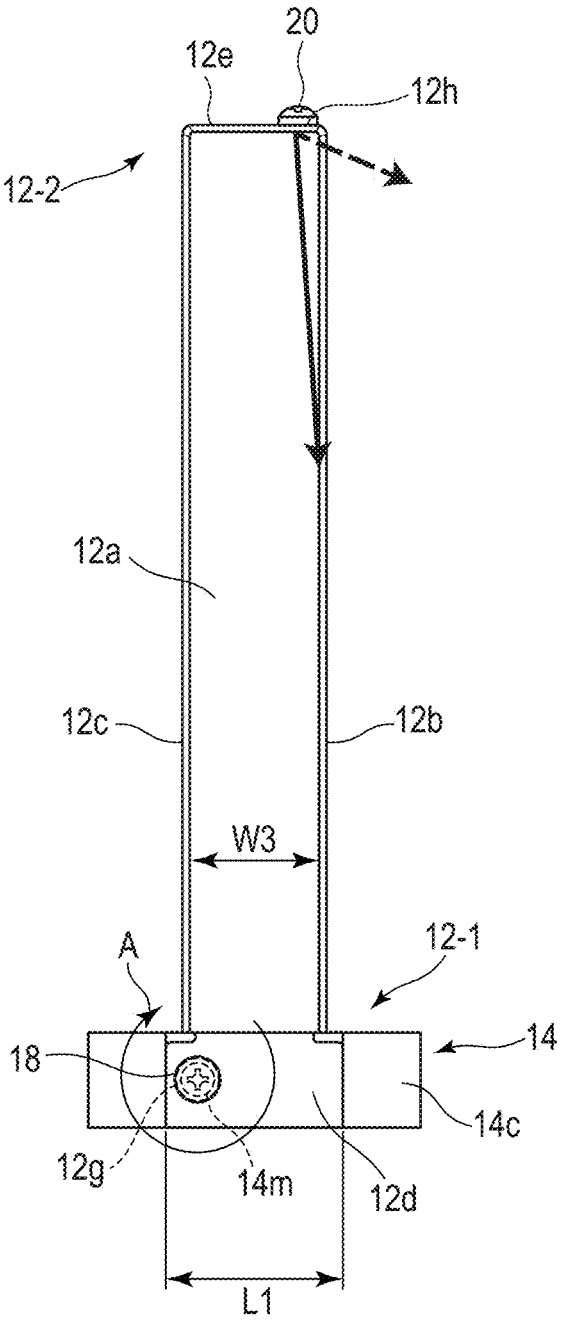
F I G. 3

ELECTRONIC COMPONENT HOUSING

CROSS-REFERENCE TO RELATED APPLICATIONS

This application is a Continuation Application of PCT Application No. PCT/JP2022/046605, filed Dec. 19, 2022 and based upon and claiming the benefit of priority from prior Japanese Patent Application No. 2022-048540, filed Mar. 24, 2022, the entire contents of all of which are incorporated herein by reference.

BACKGROUND OF THE INVENTION

1. Field of the Invention

Embodiments described herein relate generally to an electronic component housing which houses an electronic component such as a pressure sensor detecting a fluid pressure.

2. Description of the Related Art

An electronic component, for example, a pressure sensor comprises a casing serving as a housing, a pressure sensor unit arranged in the casing, and a printed circuit board connected to the pressure sensor unit (for example, see JP 2003-299230 A).

BRIEF SUMMARY OF THE INVENTION

The casing is designed to protect the electronic components arranged in its inside. For example, if the casing is divided into a plurality of casings and these casings are fixed using a plurality of screws, and if these screws become loose, the plurality of casings may be detached, making it impossible to sufficiently protect the electronic components.

The embodiment of the present application provides an electronic component housing capable of preventing screws from being loose and preventing the casing from falling out.

According to an embodiment, an electronic component housing comprises: a block including a first surface, a second surface parallel to the first surface, a third surface orthogonal to the first surface and the second surface, and a fourth surface orthogonal to the first surface and the second surface and parallel to the third surface, with the electronic component arranged therein; a first casing including a first end and a second end, the first end being arranged on the third surface of the block, and the second end including a fifth surface parallel to the second surface of the block; a first screw fixing the first end of the first casing to the third surface of the block; a second casing including a third end and a fourth end, the third end being arranged on the fourth surface of the block, and the fourth end including a sixth surface parallel to the fifth surface of the first casing; a second screw fixing the third end of the second casing to the fourth surface of the block; and a third screw fixing the sixth surface of the second casing to the fifth surface of the first casing, wherein the first screw is arranged on one side of a center in a direction intersecting a longitudinal direction of the first casing, the second screw is arranged on the other side of the center in a direction intersecting a longitudinal direction of the second casing, and the third screw is arranged on the other side of the center in the direction intersecting the longitudinal direction of the first casing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a front view showing the electronic component shown in FIG. 1.

DETAILED DESCRIPTION OF THE INVENTION

Figure 1:
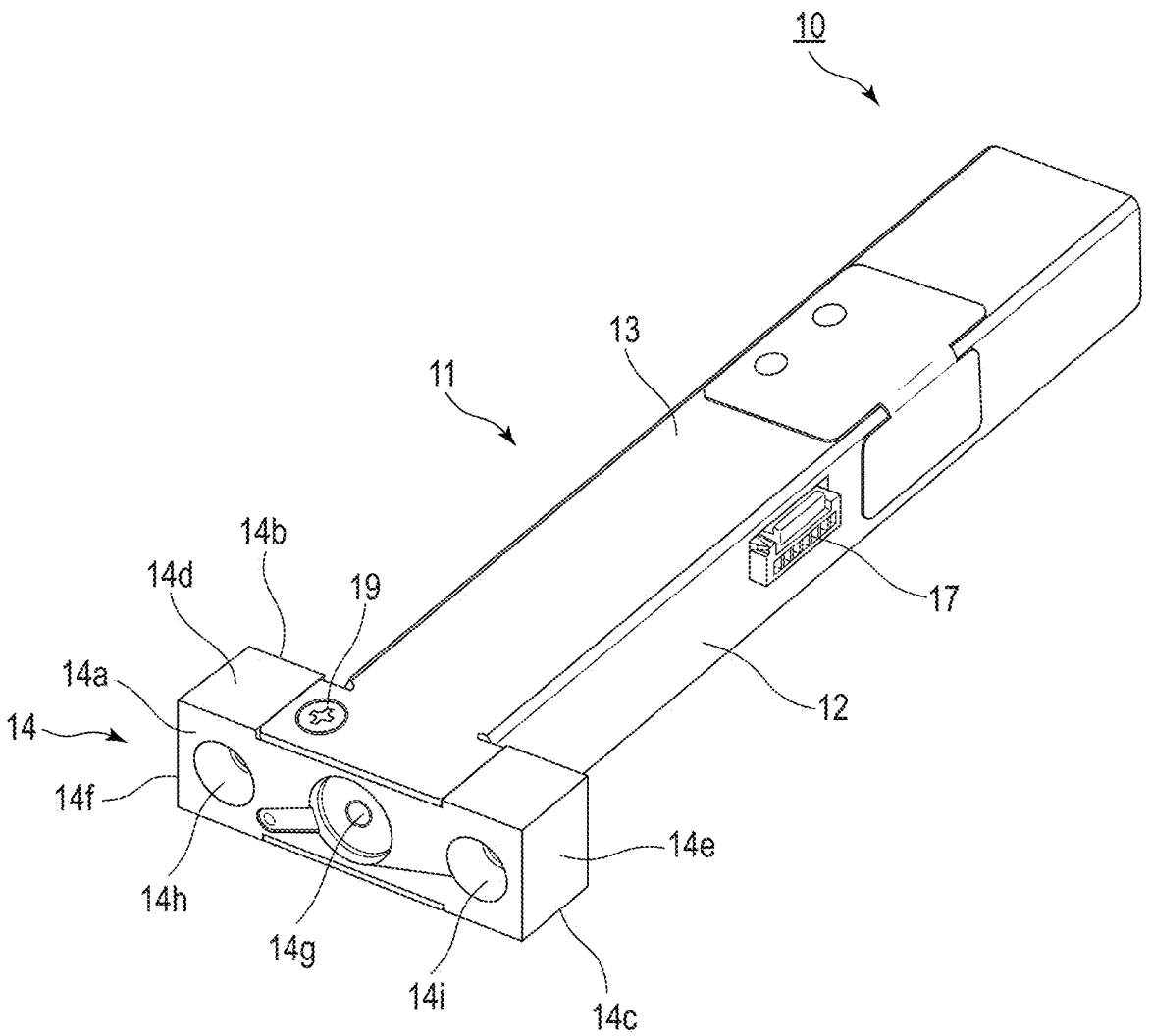
FIG. 1 is a perspective view showing an example of an electronic component according to the present embodiment.

Embodiments will be described hereinafter with reference to the accompanying drawings. In the drawings, the same portions are denoted by the same reference numerals.

FIG. 1 to FIG. 4 show an electronic component housing according to the present embodiment, illustrating a case where the electronic component housing is applied to, for example, a pressure sensor. However, the electronic component according to the present embodiment is not limited to a pressure sensor, but can also be applied to other electronic components.

A pressure sensor 10 includes a casing 11 as a housing. The casing 11 includes, for example, a first casing 12, a second casing 13, a block 14, a first screw 18, a second screw 19, and a third screw 20. A pressure sensor unit 15, a printed circuit board 16, a connector 17, and the like are housed in the casing 11. The first screw 18, the second screw 19, and the third screw 20 are also simply referred to as screws 18, 19, and 20.

The block 14 is substantially shaped in, for example, a rectangular parallelepiped, and has a rectangular first surface 14a, a second surface 14b parallel to the first surface, a third surface 14c connecting the first surface 14a and the second surface, a fourth surface 14d parallel to the third surface 14c, and two other surfaces 14e and 14f.

A configuration of the electronic component housing of the present embodiment will be schematically described with reference to FIG. 2.

A first end 12-1 of the first casing 12 is fixed to the third surface 14c of the block 14 with the screw 18. A second end 12-2 of the first casing 12 has an upper surface 12e parallel to the second surface 14b of the block 14.

A third end 13-1 of the second casing 13 is fixed to the fourth surface 14d of the block 14 with the screw 19. A fourth end 13-2 of the second casing 13 has an upper surface 13e parallel to the second surface 14b of the block 14.

The upper surface 12e of the first casing 12 and the upper surface 13e of the second casing 13 are fixed with the screw 20. The screw 18 is arranged on one side with respect to the center in the direction intersecting a longitudinal direction of the first casing 12, the screw 19 is arranged on the other side with respect to the center in the direction intersecting the longitudinal direction of the first casing 12, and the screw 20 is arranged on the other side with respect to the center in the direction intersecting the longitudinal direction of the first casing 12.

The electronic component housing will be described in detail below.

As shown in FIG. 1, an opening 14g passing through the first surface 14a and the second surface 14b is provided at the center in the longitudinal direction of the first surface 14a and the second surface 14b of the block 14. A fluid to be measured is introduced into the opening 14g. Screw holes 14h and 14i are provided on both sides of the opening 14g, on the first surface 14a of the block 14.

The first surface 14a of the block 14 is arranged on the surface of, for example, a pipe through which a fluid flows, or the like, and the block 14 is fixed to the surface of the pipe or the like by a plurality of screws (not shown) that are screwed into screw holes 14h and 14i.

Figure 2:
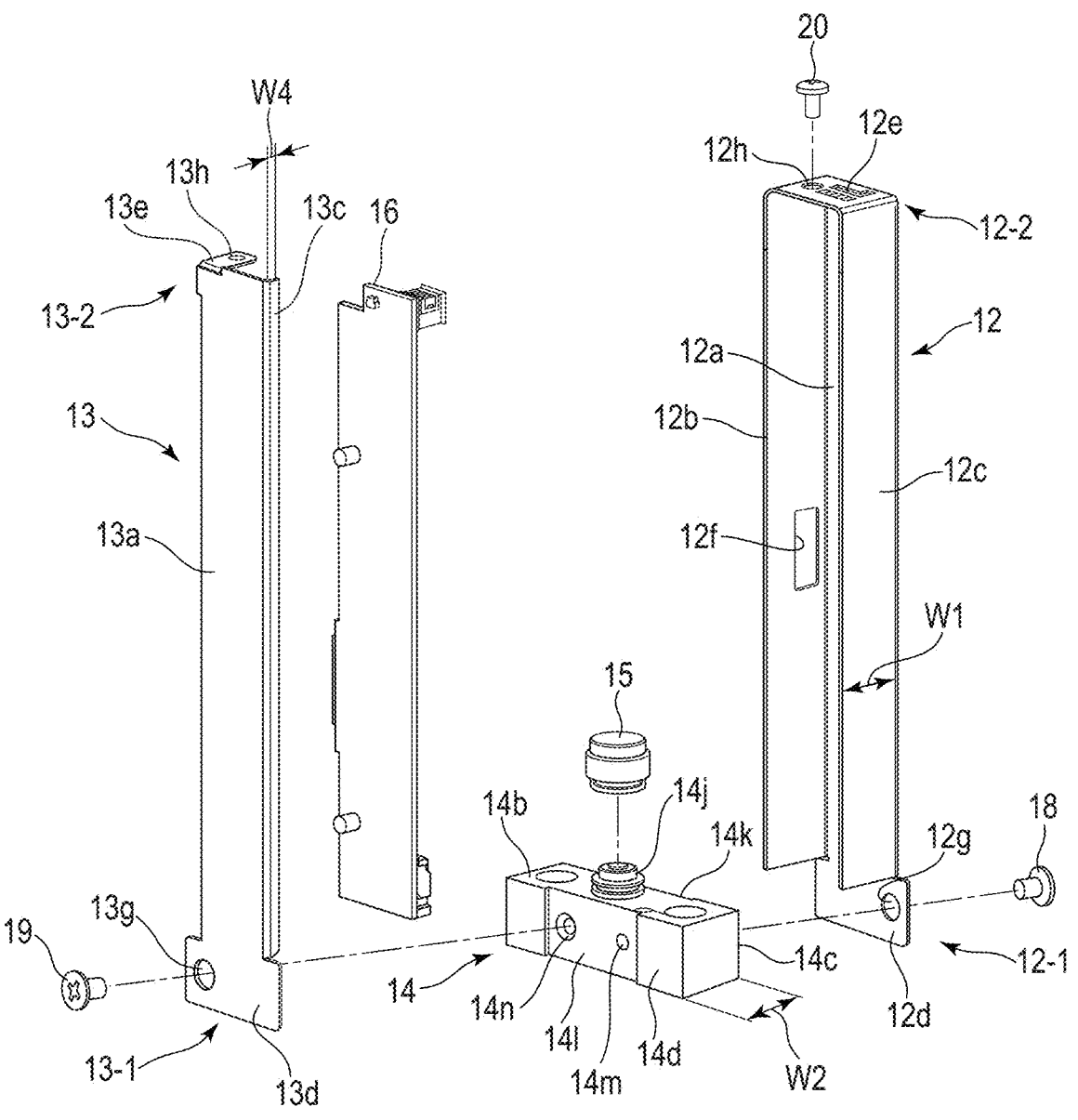
FIG. 2 is an exploded perspective view of FIG. 1.

As shown in FIG. 2, an attachment portion 14j that communicates with the opening 14g is provided on the second surface 14b of the block 14. The pressure sensor unit 15 is attached to this attachment portion 14j. The pressure sensor unit 15 includes, for example, a diaphragm (not shown), a strain sensor provided on the diaphragm, and the like. The diaphragm is deformed by the pressure of the fluid introduced into the opening 14g, and the deformation of the diaphragm is detected as an electrical signal by the strain sensor. A configuration of the pressure sensor unit 15 can be modified in various manners.

The pressure sensor unit 15 is electrically connected to the printed circuit board 16 by a wire (not shown). The printed circuit board 16 includes circuit components (not shown) that process signals supplied from the pressure sensor unit 15, and is attached to, for example, a back surface of the second casing 13.

The first casing 12 has a main surface 12a, a side surface 12b, a side surface 12c, a first attachment portion 12d, and an upper surface 12e.

The main surface 12a has, for example, a rectangular shape, and side surfaces 12b and 12c are provided on two sides of the main surface 12a along the longitudinal direction, respectively. The side surface 12b and the side surface 12c are arranged perpendicularly to the main surface 12a and are parallel to each other. A width W1 in the direction intersecting the longitudinal direction of the side surfaces 12b and 12c is equal to a width W2 between the third surface 14c and the fourth surface 14d of the block 14 (W1=W2).

The first attachment portion 12d is provided at a first end 12-1 of the main surface 12a (i.e., one longitudinal end of the main surface 12a) and as shown in FIG. 3, a length L1 in the direction intersecting the longitudinal direction of the main surface 12a is longer than a width W3 in the direction intersecting the longitudinal direction of the main surface 12a (L1>W3).

The first attachment portion 12d includes a hole 12g into which the screw 18 is inserted. The hole 12g is arranged on one side of the longitudinal center of the first attachment portion 12d. Therefore, the hole 12g is arranged on one side of the center of the width W3 in the direction intersecting the longitudinal direction of the main surface 12a.

As shown in FIG. 2, the upper surface 12e of the first casing 12 is provided at the second end 12-2 of the main surface 12a (i.e., the other end in the longitudinal direction of the main surface 12a), is perpendicular to the main surface 12a, and is arranged in the same direction as the side surface 12b and the side surface 12c. A width of the upper surface 12e is equal to the width W1 of the side surfaces 12b and 12c.

The upper surface 12e includes a hole 12h into which the screw 20 is inserted. As shown in FIG. 3, the hole 12h is arranged on the other side of the center of the longitudinal direction of the upper surface 12e (i.e., the direction intersecting the longitudinal direction of the main surface 12a).

As shown in FIG. 2, an opening 12f is provided in the longitudinal center of the side surface 12b, and the connector 17 is exposed to the outside of the first casing 12 through the opening 12f. The connector 17 is provided on the printed circuit board 16 and electrically connected to the printed circuit board 16.

The first attachment portion 12d of the first casing 12 is attached to the third surface 14c of the block 14. More specifically, the first attachment portion 12d of the first casing 12 is fitted into a recess 14k provided on the third surface 14c of the block 14. The width, length, and depth of the recess 14k are equal to the width, length, and thickness of the first attachment portion 12d. In this state, the screw 18 is inserted into the hole 12g of the first attachment portion 12d. The screw 18 is screwed into a screw hole 14m (shown in FIG. 3) provided in the recess 14k on the third surface 14c of the block 14. The first casing 12 is thereby attached to the block 14.

In a state where the first attachment portion 12d is fixed to the recess 14k of the block 14, longitudinal ends of the side surface 12b and the side surface 12c of the first casing 12 are brought into contact with the second surface 14b of the block 14.

In contrast, the second casing 13 has a main surface 13a, a side surface 13b (shown in FIG. 4), a side surface 13c, a second attachment portion 13d, and an upper surface 13e.

The main surface 13a has, for example, a rectangular shape, and side surfaces 13b and 13c are provided on two sides of the main surface 13a along the longitudinal direction, respectively. The side surface 13b and the side surface 13c are arranged perpendicularly to the main surface 13a and are parallel to each other. A width W4 in the direction intersecting the longitudinal direction of the side surfaces 13b and 13c (i.e., the width in the direction orthogonal to the width W3 of the main surface 13a) is narrower than the width W1 of the side surfaces 12b and 12c of the first casing 12 (W4<W1).

Figure 4:
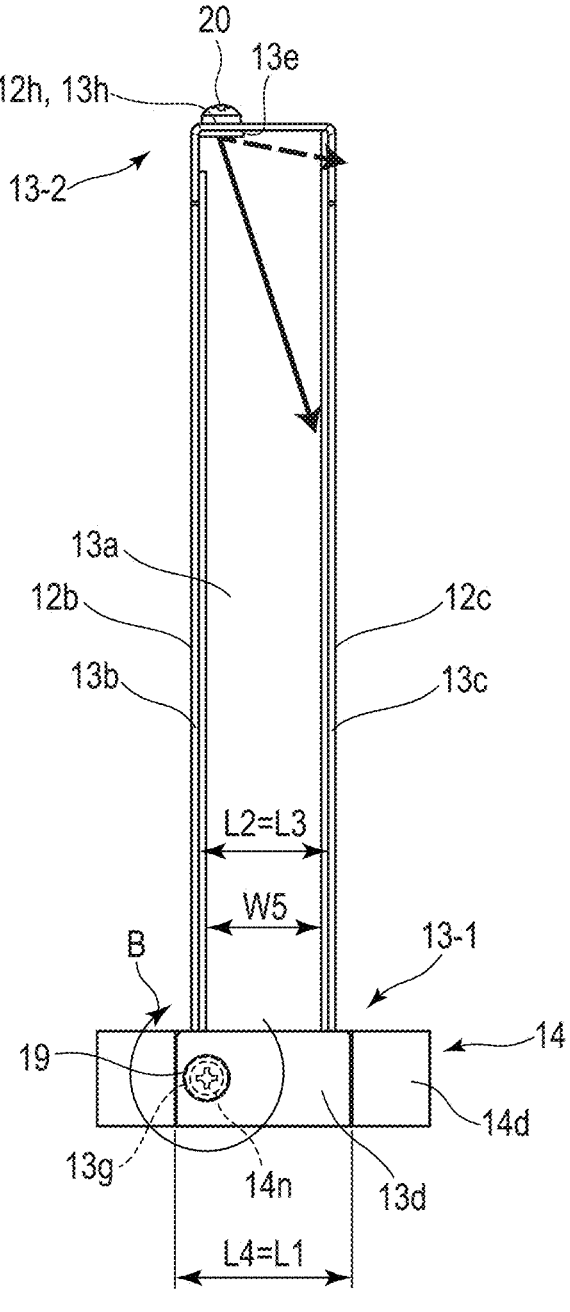
FIG. 4 is a back view showing the electronic component shown in FIG. 1.

As shown in FIG. 4, a distance L2 between the outer surface of the side surface 13b and the outer surface of the side surface 13c of the second casing 13 is equal to a distance L3 between the inner surface of the side surface 12b and the inner surface of the side surface 12c of the first casing 12 (L2=L3). For this reason, in a state where the first casing 12 and the second casing 13 are combined, the side surface 13b and the side surface 13c of the second casing 13 are inserted between the side surface 12b and the side surface 12c of the first casing 12, and the outer surface of the side surface 13b and the outer surface of the side surface 13c of the second casing 13 are brought into contact with the inner surface of the side surface 12b and the inner surface of the side surface 12c of the first casing 12.

As shown in FIG. 4, the second attachment portion 13d of the second casing 13 is provided at a third end (one longitudinal end) 13-1 of the main surface 13a of the second casing 13, and a length L4 (=L1) in the direction intersecting the longitudinal direction of the main surface 13a is longer than a width W5 in the direction intersecting the longitudinal direction of the main surface 13a (L4>W5).

As shown in FIG. 4 and FIG. 3, the second attachment portion 13*d* includes a hole 13*g* into which the screw 19 is inserted. The hole 13*g* is arranged on one side of the center in the longitudinal direction of the second attachment portion 13*d* (i.e., the other side viewed from the first casing 12 side). More specifically, the hole 13*g* is arranged on the side corresponding to the hole 12*h* into which the screw 20 of the first casing 12 is inserted from the center of the second attachment portion 13*d* in the longitudinal direction.

As shown in FIG. 2, the upper surface 13*e* of the second casing 13 is provided at a part of the fourth end (i.e., the other end in the longitudinal direction) 13-2 of the main surface 13*a*, in the direction intersecting the longitudinal direction of the main surface 13*a*. More specifically, the upper surface 13*e* of the second casing 13 is orthogonal to the main surface 13*a* and is arranged in the same direction as the side surfaces 13*b* and 13*c*.

As described later, a length from one longitudinal end of the main surface 13*a* of the second casing 13 to the outer surface of the upper surface 13*e* (L5 shown in FIG. 5) is slightly shorter than a length from one longitudinal end of the main surface 12*a* of the first casing 12 to the inner surface of the upper surface 12*e* (L6 shown in FIG. 5) (L5<L6).

The upper surface 13*e* of the second casing 13 includes a screw hole 13*h* into which the screw 20 is inserted. As shown in FIG. 4, the screw hole 13*h* is arranged on one side of the center in the direction intersecting the longitudinal direction of the main surface 12*a* (i.e., the other side viewed from the first casing 12 side).

As shown in FIG. 2, the second attachment portion 13*d* of the second casing 13 is attached to the fourth surface 14*d* of the block 14. More specifically, the second attachment portion 13*d* of the second casing 13 is fitted into a recess 14*l* provided on the fourth surface 14*d* of the block 14. The width, length, and depth of the recess 14*l* are equal to the width, length, and thickness of the second attachment portion 13*d*. In this state, the screw 19 is inserted into the hole 13*g* of the second attachment portion 13*d*. The screw 19 is screwed into a screw hole 14*n* provided in the recess 14*l* on the fourth surface 14*d* of the block 14. The second casing 13 is thereby attached to the block 14.

In a state where the second attachment portion 13*d* of the second casing 13 is fixed to the recess 14*l* of the block 14, longitudinal ends of the side surface 13*b* and the side surface 13*c* of the second casing 13 are brought into contact with the second surface 14*b* of the block 14. Furthermore, the outer surface of the side surface 13*b* of the second casing 13 is brought into contact with the inner surface of the side surface 12*b* of the first casing 12, and the outer surface of the side surface 13*c* of the second casing 13 is brought into contact with the inner surface of the side surface 12*c* of the first casing 12.

In addition, the upper surface of the upper surface 13*e* of the second casing 13 is opposed to the lower surface of the upper surface 12*e* of the first casing 12 with a slight distance. In this state, the screw 20 is screwed into the hole 12*h* provided in the upper surface 12*e* of the first casing 12 and the screw hole 13*h* provided in the upper surface 13*e* of the second casing 13, and the first casing 12 and the second casing 13 are fixed.

Figure 5:
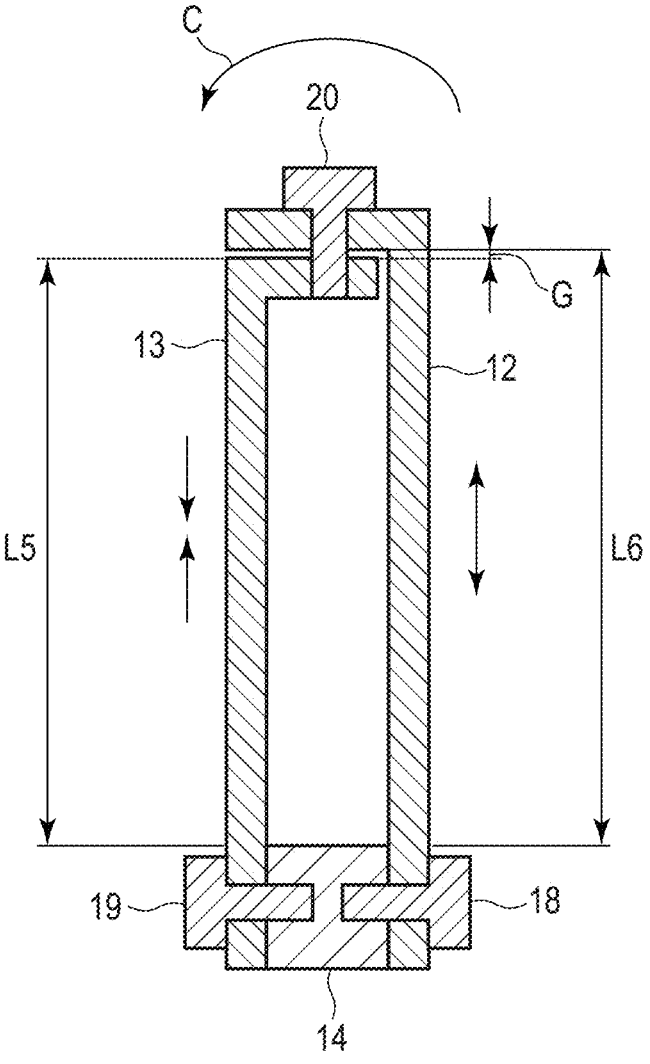
FIG. 5 is a diagram schematically showing an assembly operation of FIG. 1.

FIG. 5 schematically shows the operation for fixing the first casing 12, the second casing 13, and the block 14 with the screws 18, 19, and 20.

As described above, the length L5 from one longitudinal end of the main surface 13*a* of the second casing 13 to the upper surface of the upper surface 13*e* is slightly shorter than the length L6 from one longitudinal end of the main surface 12*a* of the first casing 12 to the lower surface of the upper surface 12*e* (L5<L6). Therefore, in the state where the first casing 12 is fixed to the block 14 with the screw 18 and the second casing 13 is fixed to the block 14 with the screw 19, a slight gap G occurs between the upper surface of the upper surface 13*e* of the second casing 13 and the lower surface of the upper surface 12*e* of the first casing 12.

In this state, when the screw 20 is tightened, the first casing 12 is expanded in the longitudinal direction, and the second casing 13 is compressed in the longitudinal direction. For this reason, as shown in FIG. 3, a force is applied to the first casing 12 by the screw 20 in a vector direction indicated by an arrow of a solid line while a force is applied to the second casing 13 by the screw 20 in a vector direction indicated by an arrow of a broken line. Therefore, a clockwise torque A is generated on the screw 18 in the casing 12, and a counterclockwise torque is generated on the screw 19 in the second casing 13. Since FIG. 4 is a view seen from the second casing 13 side, a clockwise torque B is generated on the screw 19.

The screws 18 and 19 are right-handed screws, and the clockwise torque A is generated in the first casing 12 and the clockwise torque B is generated in the second casing 13. Therefore, a frictional force between the first casing 12 and the screw 18, a frictional force between the screw 18 and the screw hole 14*m*, a frictional force between the second casing 13 and the screw 19, and a frictional force between the screw 19 and the screw hole 14*n* are increased.

Furthermore, a torque is generated in a direction of arrow C in the figure, in the first casing 12 and the second casing 13. For this reason, a frictional force between the upper surface 12*e* of the first casing 12, and the upper surface 13*e* of the second casing 13 and the screw 20 is also increased. It is therefore possible to prevent looseness of the screws 18, 19, and 20, prevent gaps from being generated between the first casing 12 and the second casing 13 and between the first casing 12, the second casing 13, and the block 14, and prevent the first casing 12 and the second casing 13 from being detached from the block 14.

Advantageous Effects of the Embodiments

According to the above-described embodiment, the first attachment portion 12*d* is fixed to the block 14 with the screw 18 in the first casing 12, the second attachment portion 13*d* is fixed to the block 14 with the screw 19 in the second casing 13, the upper surface 12*e* of the first casing 12 and the upper surface 13*e* of the second casing 13 are fixed to each other by the screw 20, the screw 18 is arranged on one side of the center in the direction intersecting the longitudinal direction of the first casing 12, the screw 19 is arranged on the other side of the center in the direction intersecting the longitudinal direction of the second casing, and the screw 20 is arranged on the other side of the center in the direction intersecting the longitudinal direction of the first casing 12 and the third casing 13. For this reason, each of the screws 18, 19, and 20 receives the torque from the first casing 12 and the second casing 13, the frictional force between the first casing 12 and the screw 18, the frictional force between the screw 18 and the screw hole 14*m*, the frictional force between the second casing 13 and the screw 19, the frictional force between the screw 19 and the screw hole 14*n*, and the frictional force between the first casing 12, the second casing 13 and the screw 20 can be increased. It is therefore possible to prevent looseness of the screws 18, 19, and 20, and prevent the first casing 12 and the second casing 13 from being detached from the block 14. The electronic components inside the casing 11 can be therefore reliably protected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic component housing comprising:

a block including a first surface, a second surface parallel to the first surface, a third surface orthogonal to the first surface and the second surface, and a fourth surface orthogonal to the first surface and the second surface and parallel to the third surface, with an electronic component arranged therein;

a first casing including a first end and a second end, the first end being arranged on the third surface of the block, and the second end including a fifth surface parallel to the second surface of the block;

a first screw fixing the first end of the first casing to the third surface of the block;

a second casing including a third end and a fourth end, the third end being arranged on the fourth surface of the block, and the fourth end including a sixth surface parallel to the fifth surface of the first casing;

a second screw fixing the third end of the second casing to the fourth surface of the block; and a third screw fixing the sixth surface of the second casing to the fifth surface of the first casing, wherein the first screw is arranged on one side of a center in a direction intersecting a longitudinal direction of the first casing, the second screw is arranged on the other side of the center in a direction intersecting a longitudinal direction of the second casing, and the third screw is arranged on the other side of the center in the direction intersecting the longitudinal direction of the first casing.

2. The electronic component housing of claim 1, wherein a length between the third end and the fourth end of the second casing is shorter than a length between the first end and the second end of the first casing.

3. The electronic component housing of claim 1, wherein a position of the first screw for the third screw is a position where a clockwise torque is applied to the first screw in the first casing, and a position of the second screw for the third screw is a position where a clockwise torque is applied to the second screw in the second casing.

4. The electronic component housing of claim 1, wherein the first casing comprises a first side surface provided at an end in the direction intersecting the longitudinal direction and a second side surface provided at the other end in the direction intersecting the longitudinal direction, and longitudinal ends of the first side surface and the second side surface are located on the second surface of the block.

5. The electronic component housing of claim 4, wherein the second casing comprises a third side surface provided at an end in the direction intersecting the longitudinal direction and a fourth side surface provided at the other end in the direction intersecting the longitudinal direction, an outer surface of the third side surface is brought into contact with an inner surface of the first side surface of the first casing, on the second surface of the block, and an outer surface of the fourth side surface is brought into contact with an inner surface of the second side surface of the first casing, on the second surface of the block.

6. The electronic component housing of claim 1, wherein the block comprises a first recess housing the first end of the first casing, on the third surface.

7. The electronic component housing of claim 1, wherein the block comprises a second recess housing the third end of the second casing, on the fourth surface.

* * * * *